(12) United States Patent
Fontana, Jr. et al.

(10) Patent No.: US 9,064,628 B2
(45) Date of Patent: Jun. 23, 2015

(54) INDUCTOR WITH STACKED CONDUCTORS

(75) Inventors: Robert E. Fontana, Jr., San Jose, CA (US); Philipp Herget, San Jose, CA (US); Eugene J. O'Sullivan, Nyack, NY (US); Lubomyr T. Romankiw, Briancliff Manor, NC (US); Naigang Wang, Ossining, NY (US); Bucknell C. Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 13/477,978

(22) Filed: May 22, 2012

(65) Prior Publication Data

US 2013/0314192 A1 Nov. 28, 2013

(51) Int. Cl.
*H01F 5/00* (2006.01)
*H01F 27/28* (2006.01)
*H01F 17/00* (2006.01)
*H01L 49/02* (2006.01)

(52) U.S. Cl.
CPC .............. *H01F 27/2804* (2013.01); *H01F 5/00* (2013.01); *H01F 17/0013* (2013.01); *H01L 28/10* (2013.01); *H01F 2017/0066* (2013.01); *H01F 2017/0086* (2013.01); *H01F 2027/2809* (2013.01)

(58) Field of Classification Search
CPC .......................... H01F 5/00; H01F 27/00–27/30
USPC ...................... 336/83, 200, 232, 65, 206–208; 257/531
See application file for complete search history.

(56) References Cited

U.S. PATENT DOCUMENTS

| | | | |
|---|---|---|---|
| 4,959,631 A | | 9/1990 | Hasegawa et al. |
| 5,379,172 A | * | 1/1995 | Liao ............................ 360/125.5 |
| 5,398,400 A | | 3/1995 | Breen |
| 5,450,755 A | | 9/1995 | Saito et al. |
| 5,465,475 A | | 11/1995 | Kinoshita et al. |
| 5,470,491 A | | 11/1995 | Kodama et al. |
| 5,548,265 A | * | 8/1996 | Saito ............................. 336/200 |
| 5,805,043 A | | 9/1998 | Bahl |
| 5,884,990 A | | 3/1999 | Burghartz et al. |
| 6,002,161 A | | 12/1999 | Yamazaki |
| 6,054,914 A | * | 4/2000 | Abel et al. .................... 336/200 |
| 6,094,112 A | | 7/2000 | Goldberger et al. |
| 6,114,937 A | | 9/2000 | Burghartz et al. |

(Continued)

OTHER PUBLICATIONS

Breen et al., "Technical Information: The Accu-L Multi-Layer Inductor for High Frequency Applications," AVX Corporation. AVX Israel Ltd., date unknown.

(Continued)

*Primary Examiner* — Tuyen Nguyen
(74) *Attorney, Agent, or Firm* — Zilka-Kotab, PC

(57) ABSTRACT

A thin film coupled inductor, a thin film spiral inductor, and a system that includes an electronic device and a power supply or power converter incorporating one or more such inductors. A thin film coupled inductor includes a wafer substrate; a bottom yoke comprising a magnetic material above the wafer substrate; a first insulating layer above the bottom yoke; a first conductor above the bottom yoke and separated therefrom by the first insulating layer; a second insulating layer above the first conductor; a second conductor above the second insulating layer; a third insulating layer above the second conductor; and a non-planar top yoke above the third insulating layer, the top yoke comprising a magnetic material.

20 Claims, 10 Drawing Sheets

(56) References Cited

U.S. PATENT DOCUMENTS

| | | | |
|---|---|---|---|
| 6,259,583 B1 | 7/2001 | Fontana, Jr. et al. | |
| 6,369,683 B1 | 4/2002 | Iida et al. | |
| 6,455,885 B1 | 9/2002 | Lin | |
| 6,573,822 B2 | 6/2003 | Ma et al. | |
| 6,649,422 B2 | 11/2003 | Kossives et al. | |
| 6,649,472 B1 | 11/2003 | Hsieh | |
| 6,710,671 B1 | 3/2004 | Tanaka | |
| 6,722,017 B2 | 4/2004 | Rittner et al. | |
| 6,856,225 B1 | 2/2005 | Chua et al. | |
| 6,890,829 B2 | 5/2005 | Cheng et al. | |
| 6,927,662 B2 | 8/2005 | Kahlmann et al. | |
| 7,041,526 B2 | 5/2006 | Shim et al. | |
| 7,064,645 B2 | 6/2006 | Kobayashi et al. | |
| 7,181,827 B2 | 2/2007 | Kamijima | |
| 7,414,506 B2 | 8/2008 | Furumiya et al. | |
| 7,429,779 B2 | 9/2008 | Itoi et al. | |
| 7,470,927 B2 | 12/2008 | Lee et al. | |
| 7,541,220 B2 | 6/2009 | Bambridge et al. | |
| 7,638,406 B2 | 12/2009 | Edelstein et al. | |
| 7,692,511 B2 | 4/2010 | Degani et al. | |
| 7,714,688 B2 | 5/2010 | Korony et al. | |
| 7,746,232 B2 | 6/2010 | Hashimoto | |
| 7,790,503 B2 | 9/2010 | Lin et al. | |
| 7,791,836 B2 | 9/2010 | Masai | |
| 7,829,427 B2 | 11/2010 | Edelstein et al. | |
| 7,842,408 B2 | 11/2010 | Kudo et al. | |
| 7,847,668 B2 | 12/2010 | Lai et al. | |
| 7,847,669 B2 | 12/2010 | Ayazi et al. | |
| 7,863,654 B2 | 1/2011 | Lin | |
| 7,969,274 B2 | 6/2011 | Brennan et al. | |
| 7,994,890 B2 | 8/2011 | Edo et al. | |
| 8,717,136 B2 | 5/2014 | Fontana, Jr. et al. | |
| 2005/0146411 A1* | 7/2005 | Gardner | 336/200 |
| 2006/0012007 A1* | 1/2006 | Ahn et al. | 257/531 |
| 2007/0202684 A1 | 8/2007 | Lin | |
| 2009/0015363 A1* | 1/2009 | Gardner | 336/200 |
| 2009/0315662 A1 | 12/2009 | Hijioka et al. | |
| 2013/0106552 A1 | 5/2013 | Fontana, Jr. et al. | |
| 2013/0176095 A1 | 7/2013 | Fontana, Jr. et al. | |
| 2014/0190003 A1 | 7/2014 | Fontana, Jr. et al. | |

OTHER PUBLICATIONS

Karimian, S., "Skin Effect Suppression in Multilayer Thin-Film Spiral Inductor Taking Advantage of Negative Permeability of Magnetic Film," Dec. 8, 2010.
Final Office Action from U.S. Appl. No. 13/287,942 dated Jul. 10, 2013.
U.S. Appl. No. 13/287,942, filed Nov. 2, 2011.
U.S. Appl. No. 13/347,571, filed Jan. 10, 2012.
Non-Final Office Action from U.S. Appl. No. 13/287,942 dated Jan. 17, 2013.
Restriction/Election Requirement from U.S. Appl. No. 13/347,571 dated Aug. 29, 2012.
Non-Final Office Action from U.S. Appl. No. 13/347,571 dated Oct. 4, 2012.
Final Office Action from U.S. Appl. No. 13/347,571 dated Mar. 13, 2013.
Non-Final Office Action from U.S. Appl. No. 13/287,942 dated Nov. 19, 2013.
Final Office Action from U.S. Appl. No. 13/287,942 dated Jun. 19, 2014.
Supplemental Notice of Allowabiity from U.S. Appl. No. 13/347,571 dated Mar. 6, 2014.
Advisory Action from U.S. Appl. No. 13/287,942, dated Oct. 1, 2014.
Non-Final Office Action from U.S. Appl. No. 13/287,942, dated Nov. 10, 2014.
Fontana et al., U.S. Appl. No. 14/207,319, filed Mar. 12, 2014.
Qiu et al., "Inductor Design for VHF Tapped-Inductor DC-DC Power Converters," 2011 IEEE, pp. 142-149.
Notice of Allowance and Fee(s) Due from U.S. Appl. No. 13/347,571 dated Dec. 19, 2013.

* cited by examiner

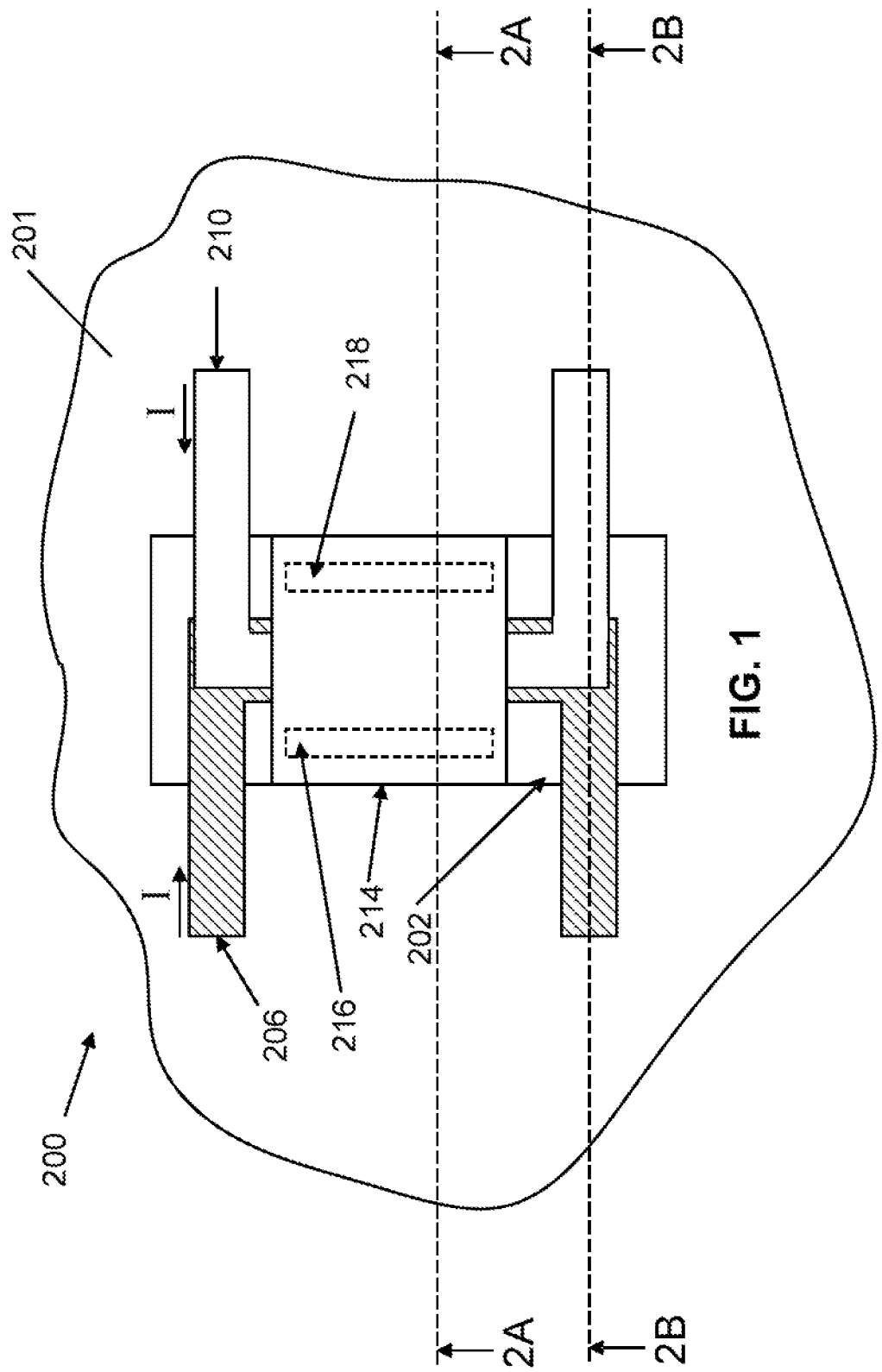

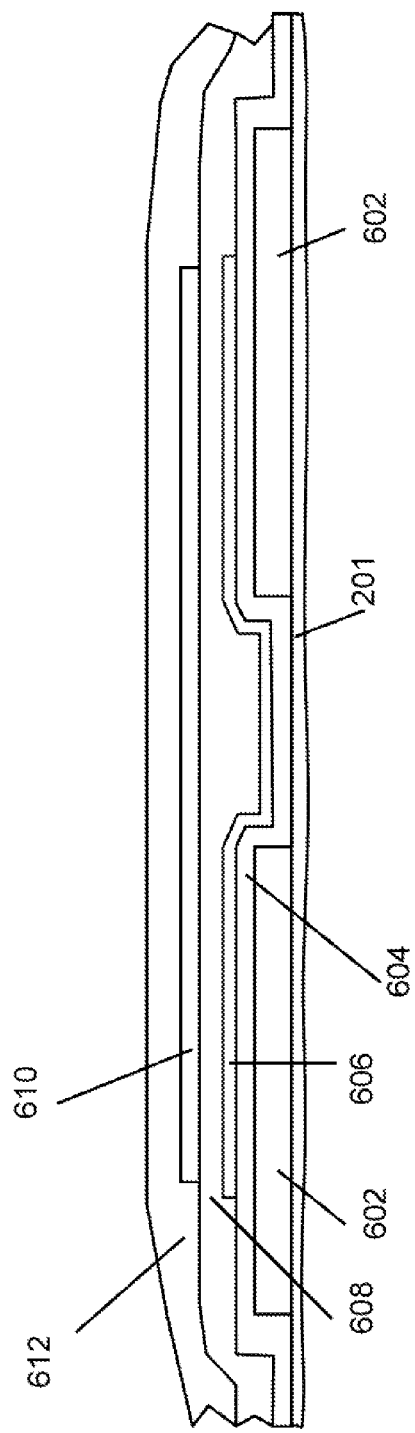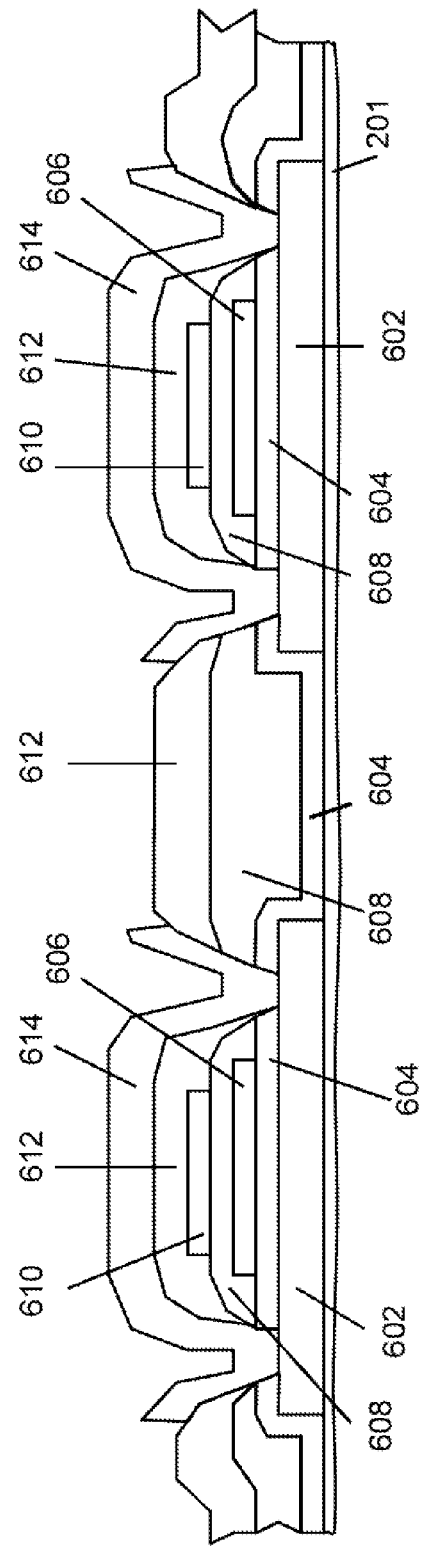

US 9,064,628 B2

INDUCTOR WITH STACKED CONDUCTORS

BACKGROUND

The present invention relates to inductors, and more particularly, this invention relates to thin film ferromagnetic inductors having stacked conductors.

The integration of inductive power converters onto silicon is one path to reducing the cost, weight, and size of electronics devices. One main challenge to developing a fully integrated power converter is the development of high quality thin film inductors. To be viable, the inductors should have a high Q, a large inductance, and/or a large energy storage per unit area.

SUMMARY

A thin film coupled inductor according to one embodiment includes a wafer substrate; a bottom yoke comprising a magnetic material above the wafer substrate; a first insulating layer above the bottom yoke; a first conductor above the bottom yoke and separated therefrom by the first insulating layer; a second insulating layer above the first conductor; a second conductor above the second insulating layer; a third insulating layer above the second conductor; and a non-planar top yoke above the third insulating layer, the top yoke comprising a magnetic material.

A thin film spiral inductor according to one embodiment includes a wafer substrate; a bottom yoke comprising a magnetic material above the wafer substrate; a first insulating layer above the bottom yoke; a first turn of a spiral conductor above the bottom yoke and separated therefrom by the first insulating layer; a second insulating layer above the first turn; a second turn of the spiral conductor above the second insulating layer; a third insulating layer above the second turn; and a non-planar top yoke above the third insulating layer, the top yoke comprising a magnetic material.

A system according to one embodiment includes an electronic device; and a power supply or power converter incorporating an inductor as recited above.

Other aspects and embodiments of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

FIG. 1 is a top view of a thin film inductor according to one embodiment.

FIG. 6B is a cross sectional view taken along line 6B-6B of FIG. 6A.

FIG. 6C is a cross sectional view taken along line 6C-6C of FIG. 6A.

DETAILED DESCRIPTION

Figure 2A:
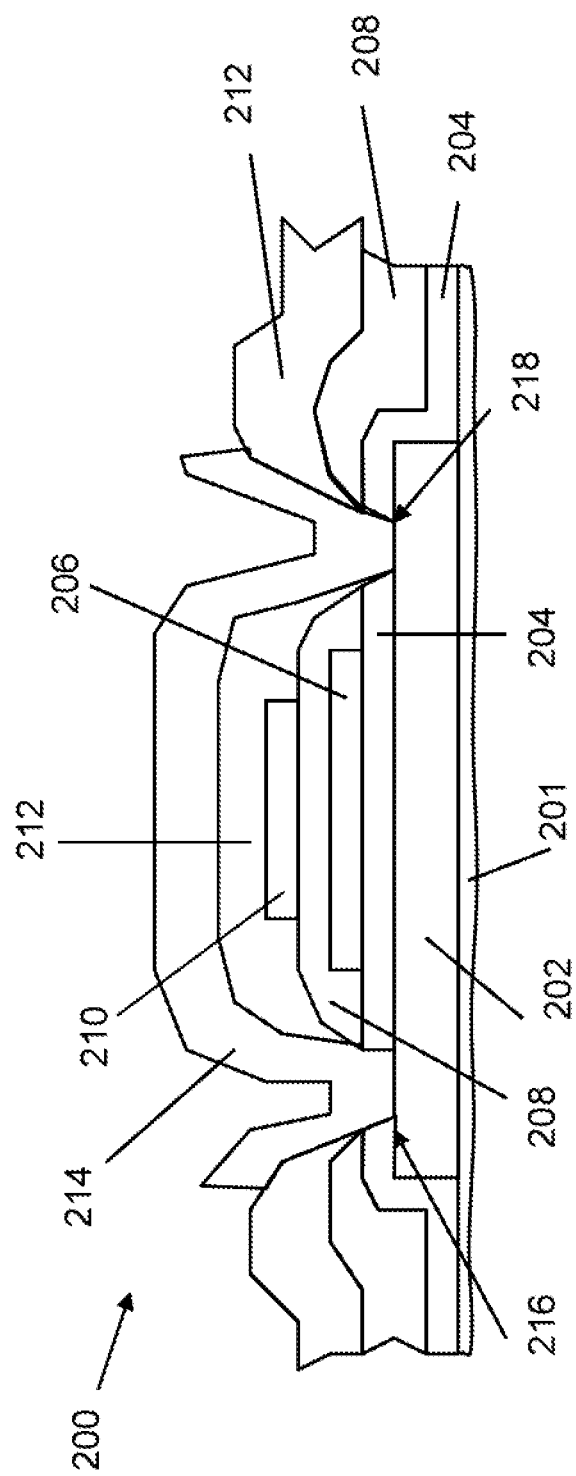
FIG. 2A is a cross sectional view taken along line 2A-2A of FIG. 1.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of thin film inductor structures having conductors surrounded by ferromagnetic yokes, where the conductors are stacked vertically. The resulting inductor has increased coupled inductor efficiency, lower conductor resistance loss, and/or minimized inductor area.

In one general embodiment, a thin film coupled inductor includes a wafer substrate; a bottom yoke comprising a magnetic material above the wafer substrate; a first insulating layer above the bottom yoke; a first conductor above the bottom yoke and separated therefrom by the first insulating layer; a second insulating layer above the first conductor; a second conductor above the second insulating layer; a third insulating layer above the second conductor; and a non-planar top yoke above the third insulating layer, the top yoke comprising a magnetic material.

In another general embodiment, a thin film spiral inductor includes a wafer substrate; a bottom yoke comprising a magnetic material above the wafer substrate; a first insulating layer above the bottom yoke; a first turn of a spiral conductor above the bottom yoke and separated therefrom by the first insulating layer; a second insulating layer above the first turn; a second turn of the spiral conductor above the second insulating layer; a third insulating layer above the second turn; and a non-planar top yoke above the third insulating layer, the top yoke comprising a magnetic material.

In yet another general embodiment, a system includes an electronic device; and a power supply or power converter incorporating an inductor as recited herein.

The integration of inductive power converters onto silicon is one path to reducing the cost, weight, and size of electronics devices. Two main challenges are achieving a high power density and a high efficiency. One way to meet these desirable aspects is by using a multi-phase buck power converter having coupled inductors. This type of converter according to various embodiments may use thin film inductors as described herein.

Step down power conversion using inductors is typically accomplished using a buck converter circuit. The circuit contains switches that charge and discharge an inductor to produce a stepped down output voltage. The current flowing through the inductor is a sum of the AC switching currents combined with a DC current. The two currents add to saturate the inductor, causing the output current to be limited by both AC and DC currents.

By using coupled inductors in a multiphase converter, a buck circuit can be configured such that neighboring phases have equal and opposite DC currents. Since these currents produce opposing flux, they cancel and don't contribute to saturation of the inductor. As a result higher currents can be used, which in turn increases the achievable power density. The magnitude of the cancellation depends on the amount of coupling present in the inductor. It is therefore desirable to maximize the coupling to achieve a high current output.

Furthermore, reducing the DC resistance of the inductors is important, especially when coupling is present. Since the resistance losses are proportional to the square of the current, the inductor's resistance becomes more significant as the coupling increases. By reducing the resistance, the power converter becomes more efficient.

Preferred embodiments are coupled inductors designed such that neighboring phases create DC flux in opposing directions. Since the opposing fluxes cancel, a much higher current can be reached before the core is saturated. The amount of cancellation that can be achieved is determined by the coupling constant. An inductor designed with a high coupling constant can greatly increase the achievable current per unit area.

Figure 2B:
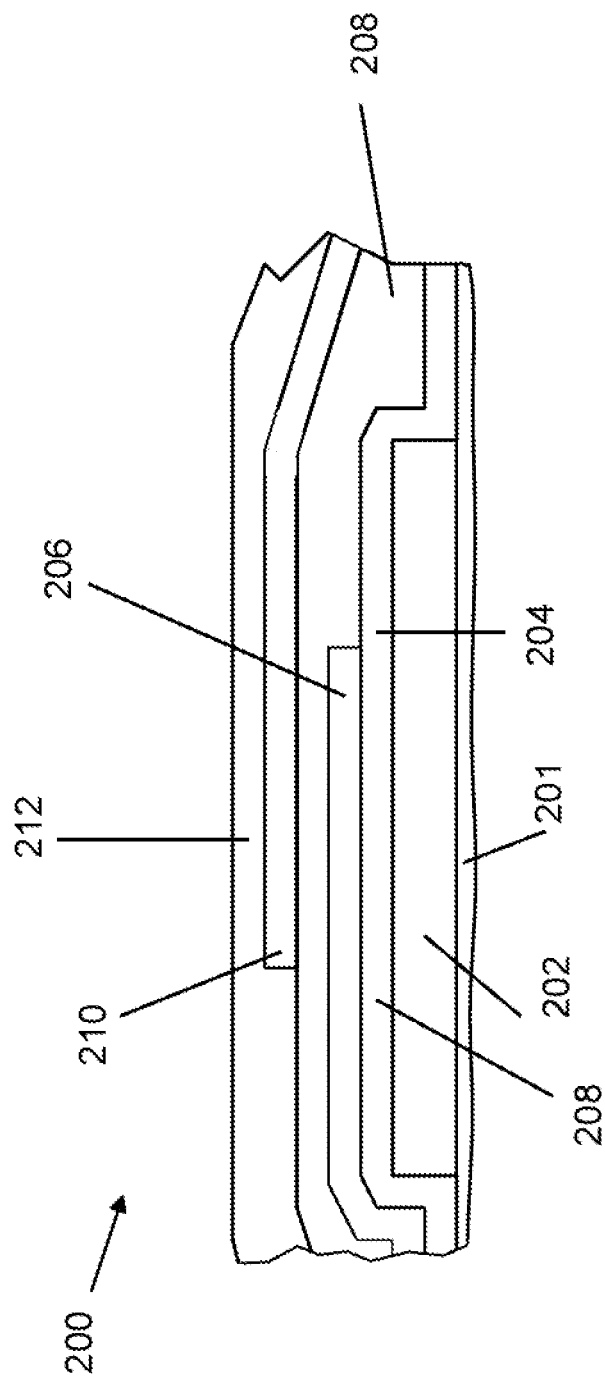
FIG. 2B is a cross sectional view taken along line 2B-2B of FIG. 1.
Figure 3A:
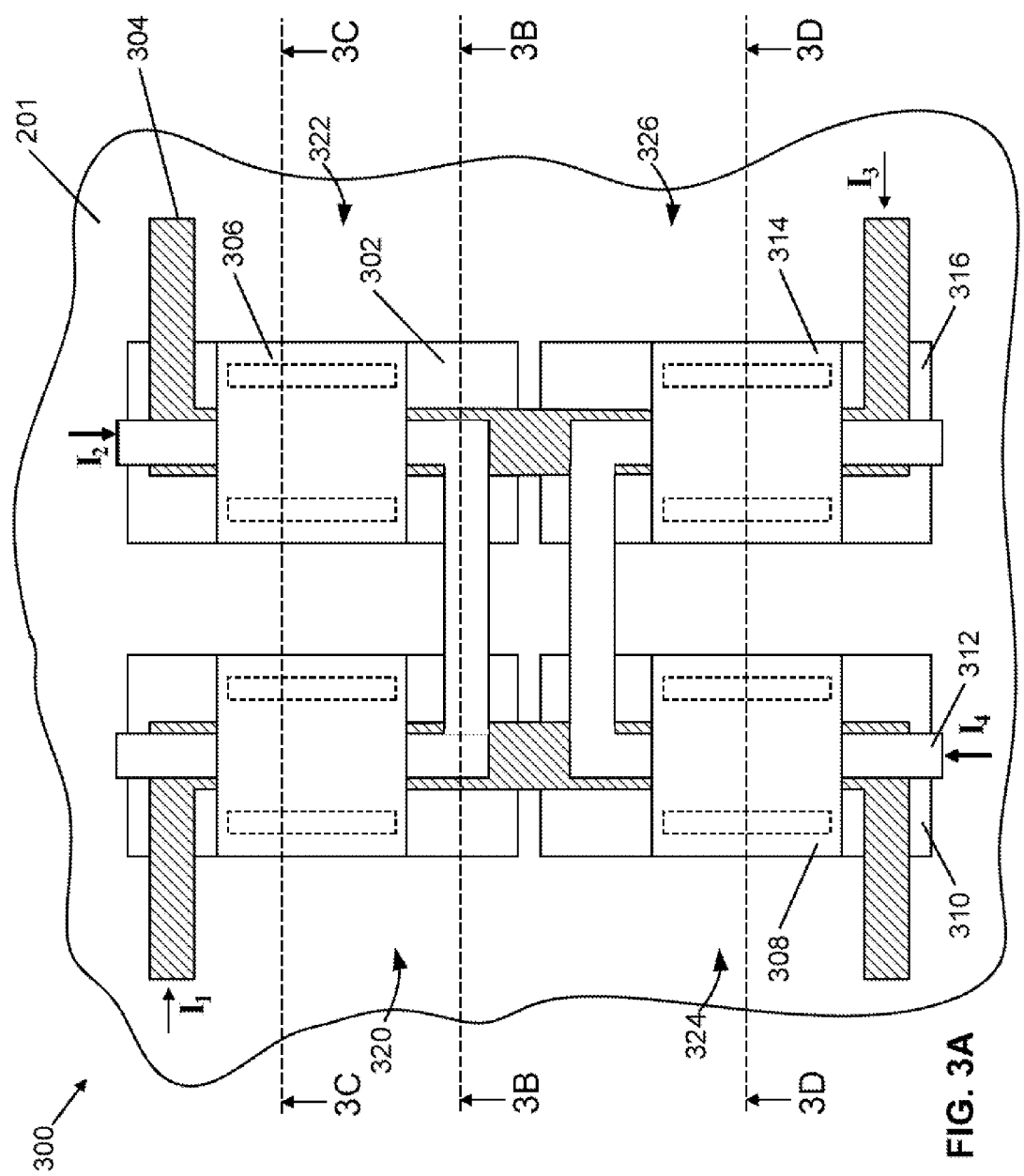
FIG. 3A is a top view of a thin film inductor according to one embodiment.
Figure 3B:
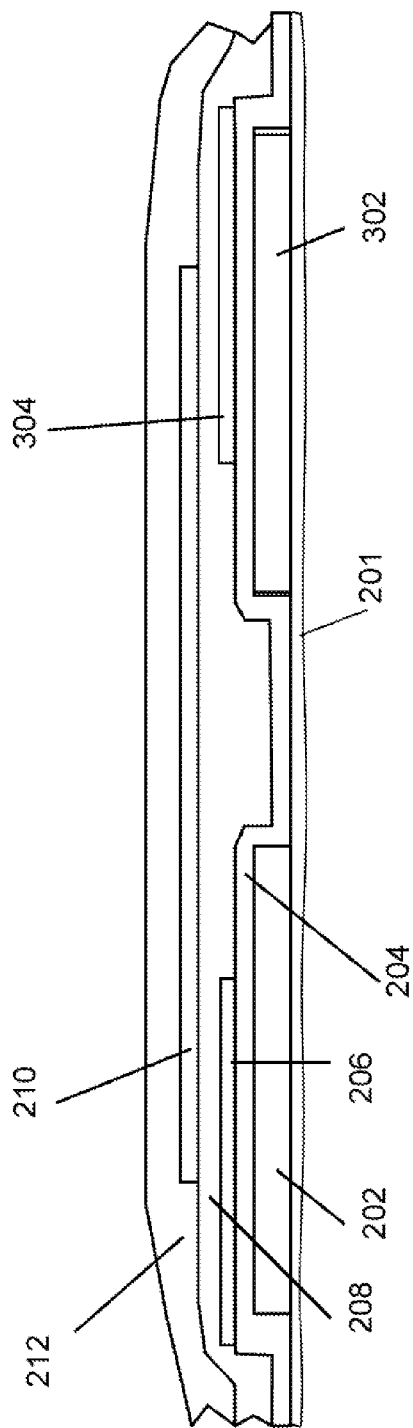
FIG. 3B is a cross sectional view taken along line 3B-3B of FIG. 3A.
Figure 3C:
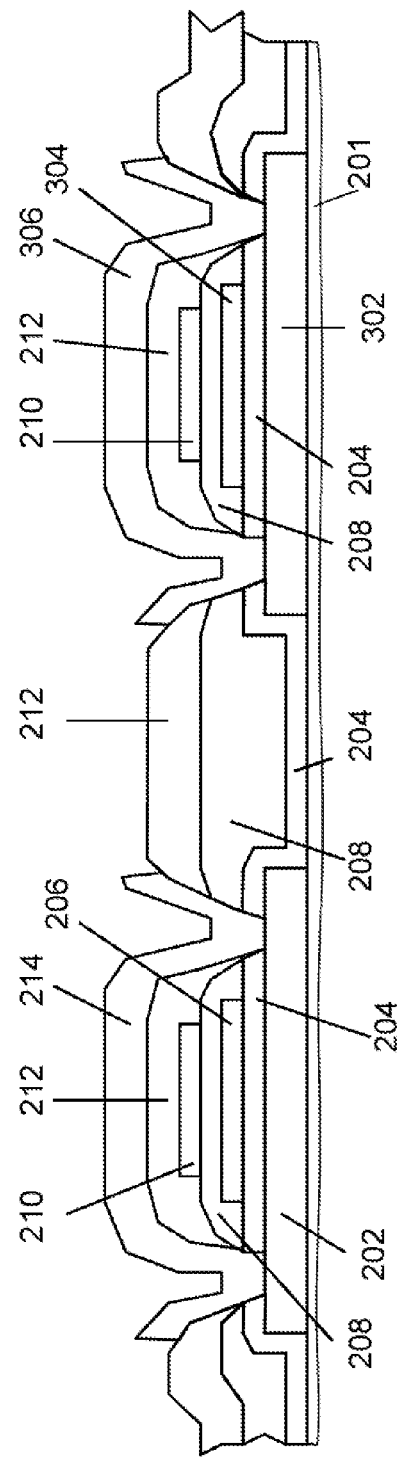
FIG. 3C is a cross sectional view taken along line 3C-3C of FIG. 3A.
Figure 3D:
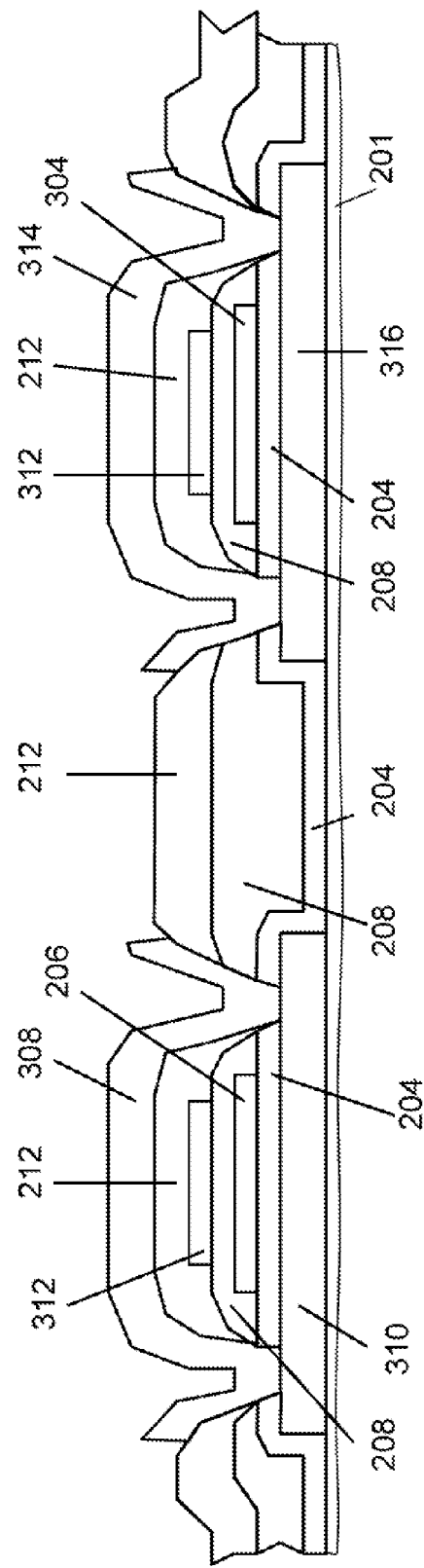
FIG. 3D is a cross sectional view taken along line 3D-3D of FIG. 3A.

Now referring to FIGS. 1-2B, a partial view of a thin film coupled inductor 200 is shown in accordance with one embodiment. In various approaches, a coupled inductor may have conductors 206, 210 in which the currents travel in nonparallel, and preferably opposite (antiparallel), directions under the top yoke 214. As depicted in the cross-sectional views of FIGS. 2A-2B, a thin film coupled inductor 200 may include a wafer substrate 201 of any type known in the art, e.g., silicon, AlTiC, glass, etc.; and a bottom yoke 202 above the wafers substrate 201.

In various approaches, the bottom yoke 202 may incorporate magnetic materials which may include iron alloys, nickel alloys, cobalt alloys, ferrites, etc. or any other magnetic material which may be apparent in various embodiments to one of skill in the art upon reading the present description. In further approaches, a yoke may be constructed using laminated films.

The thin film coupled inductor 200 may further include a first insulating layer 204 above the bottom yoke 202. Various approaches may include a first insulating layer 204 which may include alumina, silicon oxides, resists, polymers, etc. or any other insulating material known in the art.

With continued reference to FIGS. 2A-2B, the thin film coupled inductor 200 may further include a first conductor 206 above the bottom yoke 202 and separated therefrom by the first insulating layer 204. In one approach, a first conductor 206 may include any conductor material known in the art or any other conductive material which may be apparent in various applications to one of skill in the art upon reading the present description.

The thin film coupled inductor 200 may further include a second insulating layer 208 above the first conductor 206, which may also include a second conductor 210 above the second insulating layer 208. A third insulating layer 212 may also be incorporated above the second conductor 208.

In one approach, a first 204 and/or second 208 and/or third 212 insulating layer may be composed of different, similar or the same materials of each other, or any combination thereof which may include insulating metal oxides, organic materials, polymerics, etc. or any of the insulating materials described above including any other insulating material which would be apparent in various embodiments to one of skill in the art upon reading the present description.

Similarly, in one approach, a first conductor 206 and a second conductor 210 may include different, similar or the same materials as each other, or any combination thereof which may include any of the conductive materials described above, including any other conductive material which would be apparent in various embodiments to one of skill in the art upon reading the present description. In a preferred approach, the second conductor 210 is the same approximate size as the first conductor 206. However, according to various other approaches, the second conductor 210 may be smaller or larger than the first conductor 206.

Figure 6A:
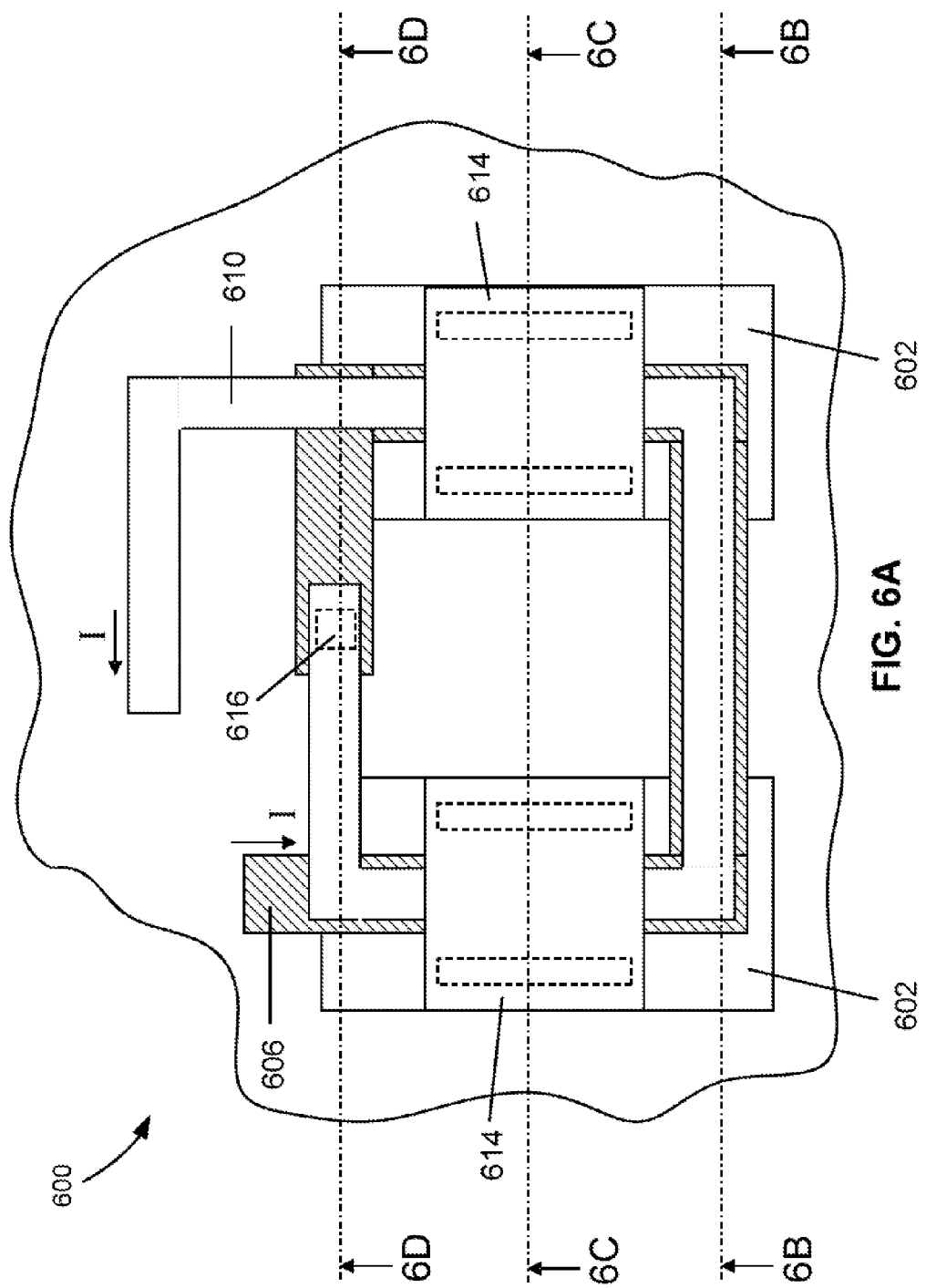
FIG. 6A is a top view of a spiral thin film inductor according to one embodiment.

In another approach, at least one of the conductors may have a spiral shape. Moreover, any number of spiral turns may be used, such as 2, 3, 4, 5, 6, 10, 20, etc. and any value in between. See e.g., FIG. 6A.

Referring now to FIG. 2A, the thin film coupled inductor 200 may further include a non-planar top yoke 214 above the third insulating layer 212, where the top yoke 214 may incorporate a magnetic material. In various approaches the bottom yoke 202 and top yoke 214 may include different, similar or the same materials as each other, or any combination thereof which may include any of the yoke materials described above, including any other conductive material which would be apparent in various embodiments to one of skill in the art upon reading the present description. In a preferred embodiment, both the top and bottom yokes may include a magnetic material.

In one approach, a first 206 and a second 210 conductors may extend beyond edges of the bottom 202 and top 214 yokes, whereupon the bottom 202 and top 214 yokes do not cover the entirety of the first 206 and the second 210 conductors.

In any approach, the dimensions of the various parts may depend on the particular application for which the thin film inductor will be used. One skilled in the art armed with the teachings herein would be able to select suitable dimensions without needing to perform undue experimentation.

In additional embodiments the top yoke may have planar portions which may improve the magnetic properties of the corresponding yoke; however, the yoke is not planar across its entire plane of deposition. This also includes embodiments where the top yoke includes arms of magnetic material directly coupled to and extending downward from an upper layer, which itself may be planar. Thus, in some approaches, the yokes are not on parallel planes in all regions.

In various approaches, the yokes as well as the conductors may be formed by any thin film processing techniques including but not limited to electroplating, sputter deposition, in-situ, etc. or any other thin film process known in the art.

In one approach the top and bottom yoke may be coupled to each other by a low reluctance path in via regions 216, 218 of the inductor. In various approaches, the top and bottom yokes may be in direct contact, separated by a thin nonmagnetic layer (e.g., ruthenium, copper, gold, alumina, silicon oxides, polymers, etc. or any other nonmagnetic material known in the art), etc. or any other configuration within a via region of the thin film inductor, which would be apparent in various embodiments to one of skill in the art upon reading the present description.

In a preferred approach, the via regions may be positioned towards ends of the top and bottom yokes thereby sandwiching all conductors between the top and bottom yokes therebetween.

With continued reference to FIGS. 1-2B, preferred approaches may include each layer 204, 208, 212 of electrically insulating material having physical and structural characteristics of being created by a single layer deposition. For example, the electrically insulating material may have a structure having no transition or interface that would be characteristic of multiple deposition processes; rather the layer is a single contiguous layer without such transition or interface. Such layer may be formed by a single deposition process such as sputtering, spincoating, etc. that forms the layer of electrically insulating material to the desired thickness, or greater than the desired thickness (and subsequently reduced via a subtractive process such as etching, milling, etc. or reflowed by processes such a baking to get the desired dimensions and material properties.).

Various approaches which incorporate polymeric layers have the advantage of possibly being applied by spin coating, resulting in layer thicknesses in the multiple micron range (e.g., 1 μm to 10 μm or higher or lower) being achievable. In one approach, the thickness range for the first layer of polymeric insulation applied between the conductors and the bottom yoke is preferably sufficient to provide for a continuous and conformal coating over the edges of the bottom yokes. This may be most easily achieved with a polymeric thickness that is equal to or greater than the thickness of the bottom yoke, e.g., about 1.5× times the thickness of the bottom yoke. For an illustrative yoke thickness of 2 μm, the polymer thickness should be ideally in the 2.0 to 3.0 μm range or greater. This range of thickness is typically determined by the conductor thicknesses. Illustrative polymer layer thicknesses may be in the 5 μm range, but may be higher or lower.

In various approaches, polymeric insulators of any type may be used. For example, one class is photo active photoresist that can be spin coated over a structure, exposed and developed to remove the photoresist in unwanted areas, and then hard baked at temperatures in the 200° C. range to harden and stabilize the resist. One advantage of the baking process is that the resist structure shrinks and topography of the final structure is domed with controlled sloped edges, losing its sharp corners. A second class includes non photo active types of polyimides that can be spin coated over a structure and then baked at temperatures in the 200° C. range to harden and stabilize the material. After hardening, a masking step and etch may be used to remove the polyimide in unwanted areas. A disadvantage of the polyimide structure is that it is more difficult to achieve dome-like structures and this doming is usually achieved by using non-anisotropic etch processes during the removal of the polyimide. In both cases a thermal post treatment may be utilized to cause the deformation of the straight edges to become rounded. Consequently, the polymeric layer allows for conformality across the edges.

In another approach, the second conductor may have opposite sidewalls along a length thereof that may be about vertically aligned with opposite sidewalls of the first conductor extending along a length of the first conductor. In another approach, the first and second conductors may be misaligned.

In a further approach, a width of each conductor in a direction perpendicular to a plane of deposition thereof and perpendicular to a longitudinal axis thereof may be at least 5 times a deposition thickness thereof, but may be more. The present approach allows for several design advantages over traditional spiral inductors and over existing coupled inductors, which will be discussed in further detail below.

One advantage over traditional spiral inductors and existing coupled inductors is reduced conductor losses. By adding a second conducting layer above a first conducting layer, the widths of the conductors in both layers can be increased while retaining the same lateral dimensions for a traditional yoke structure. Such an increase in width of the conductors allows for a reduced resistance for the current flowing through such conductors, thus improving the efficiency of the inductor.

Another advantage over traditional inductors is a greatly reduced required area for the overall inductor. Clearly, the use of stacked inductors in an inductor design improves the areal efficiency of the inductor design, allowing for more inductors per chip for power conversion. This is a desired advantage due to the limited amount of space on the processor die available for the inductor. Such an improvement may allow for, according to some embodiments, more inductors to be placed on a given chip for improved power conversion.

Moreover, in one approach, the reduced resistance in the conductors may be combined with the reduced overall required area of the inductor, to further increase efficiency of the thin film coupled inductor.

In approaches in which the second conductor is positioned above the first conductor, the distance between the top and bottom yoke is increased due to the overall added thickness of the second conductor, as well as the insulation layer which may be preferably separating the first and second conductors. Such an increase in separation between the top and bottom yoke may also allow for further improvements in the efficiency of the inductor. Approaches with such increased top to bottom yoke separation of coupled inductors may result in a larger coupling constant and improved efficiency of the power converter.

Furthermore, a magnetic field is created by the current flowing in the conductors, which interacts with the yoke material. High permeability of the yokes confines the majority of the flux created by each conductor to the yokes, leading to a large coupling. The portion of the flux that is not confined to the yokes, but leaks between the top and bottom yokes of traditional coupled inductor structures causes a reduction of this coupling.

The leakage phenomenon is more pronounced when the aspect ratio of the structure becomes large. This leakage prevents some of the flux created by the first conductor from circulating around the second conductor, thereby reducing the magnitude of the coupling and affecting the efficiency of the inductor.

However, by positioning the second conductor above the first conductor, the aspect ratio of the inductor is reduced which results in a larger amount of the field induced by the first conductor to circulate in the second conductor, or visa-versa. As a result, an inductor with vertically stacked conductors has a higher coupling coefficient.

In another approach, the conductors and top yoke may have physical characteristics of in-situ formation by thin film processing. According to various approaches, such physical characteristics may include, but are not limited to, conformal shape of the top yoke, interfaces characteristic of the formation method used, including any other physical characteristics which would be apparent in various embodiments to one of skill in the art upon reading the present description.

Now referring to FIGS. 3A-3D, a 4-phase coupled inductor 300, according to an illustrative embodiment, is shown having similar components as that of the inductor 200 of FIGS. 1-2B. In one approach, the 4-phase coupled inductor 300 may include four inductors 320, 322, 324, 326. According to various other approaches, a multi-phase coupled inductor may include at least one, at least two, at least four, at least five, etc. inductors.

As shown in FIGS. 3A-3D, a 4-phase coupled inductor 300 may include a wafer substrate 201 of any type known in the art, e.g., silicon, AlTiC, glass, etc., One, at least one, some, all, etc. of the inductors 320, 322, 324, 326 may include similar and/or the same components as that of the inductor 200 depicted in FIGS. 1-2B. As depicted, all of the inductors 320, 322, 324, 326 have similar and/or the same components as that of the inductor 200 depicted in FIGS. 1-2B, with various components of the first inductor being numbered the same as corresponding components in FIGS. 1-2B.

In one approach, the second inductor 322 may include a bottom yoke 302 (e.g., of any type described and/or suggested herein) above the wafers substrate 201. As shown, the second inductor 322 may further include a first conductor 304 (e.g., of any type described and/or suggested herein) above the bottom yoke 302 and separated therefrom by the first insulating layer 204. In another approach, the second inductor 322 may further include a non-planar top yoke 306 (e.g., of any type described and/or suggested herein) above the third insulating layer 212.

With continued reference to FIGS. 3A-3D, the third inductor 324 may include a top and bottom yoke 308, 310 respectfully. According to various approaches, top and bottom yoke 308, 310 may include any type described and/or suggested herein.

The third inductor 324 may further include a second conductor 312 (e.g., of any type described and/or suggested herein) above the first conductor 206.

With continued reference to FIGS. 3A-3D, the fourth inductor 326 may include a top and bottom yoke 314, 316 respectfully. According to various approaches, top and bottom yoke 314, 316 may include any type described and/or suggested herein.

Figure 4:
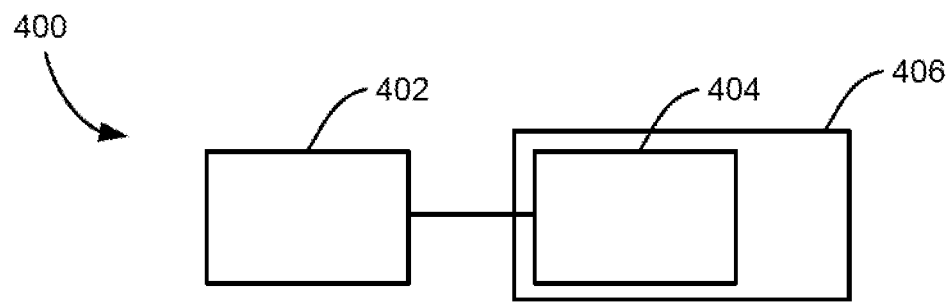
FIG. 4 is a simplified diagram of a system according to one embodiment.

Now referring to FIG. 4, in one approach, a system 400 may include an electronic device 402; and a power supply or power converter 406 incorporating a thin film coupled inductor 404 according to any of the embodiments disclosed herein.

In various embodiments, such electronic device may include a circuit or component thereof, chip or component thereof, microprocessor or component thereof, application specific integrated circuit (ASIC), etc. In further embodiments, the thin film inductor and the electronic device are physically constructed on a common substrate. Thus, in some approaches, the thin film inductor may be integrated in a chip, microprocessor, ASIC, etc.

In another approach, the thin film inductor may be formed on a first chip that is coupled to a second chip having the electronic device. For example, the first chip may act as an interposer between the power supply, power source, or converter and the second chip. The first and/or second chip may incorporate any of the chips mentioned herein, including, but not limited to chips for mobile telephones, computers, personal digital assistants (PDAs), portable electronic devices, etc. or any other chip which would be apparent in various embodiments to one of skill in the art upon reading the present description. Moreover, the power supply or converter may include a power supply line, a transformer, etc.

Additional applications, according to various embodiments include power conversion for LED lighting, power conversion for solar power, etc. For example, one illustrative approach may include a solar panel, a power converter having an inductor as described herein, and a battery. Moreover, in use, any of the thin film inductor approaches disclosed herein may be used in any application in which an inductor is useful.

Figure 5:
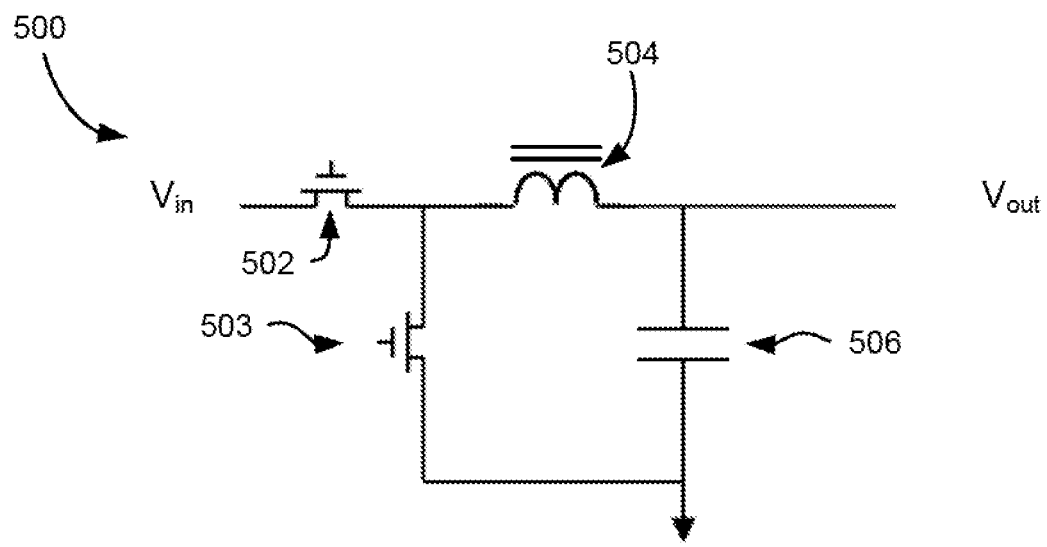
FIG. 5 is a simplified circuit diagram of a system according to one embodiment.
Figure 6D:
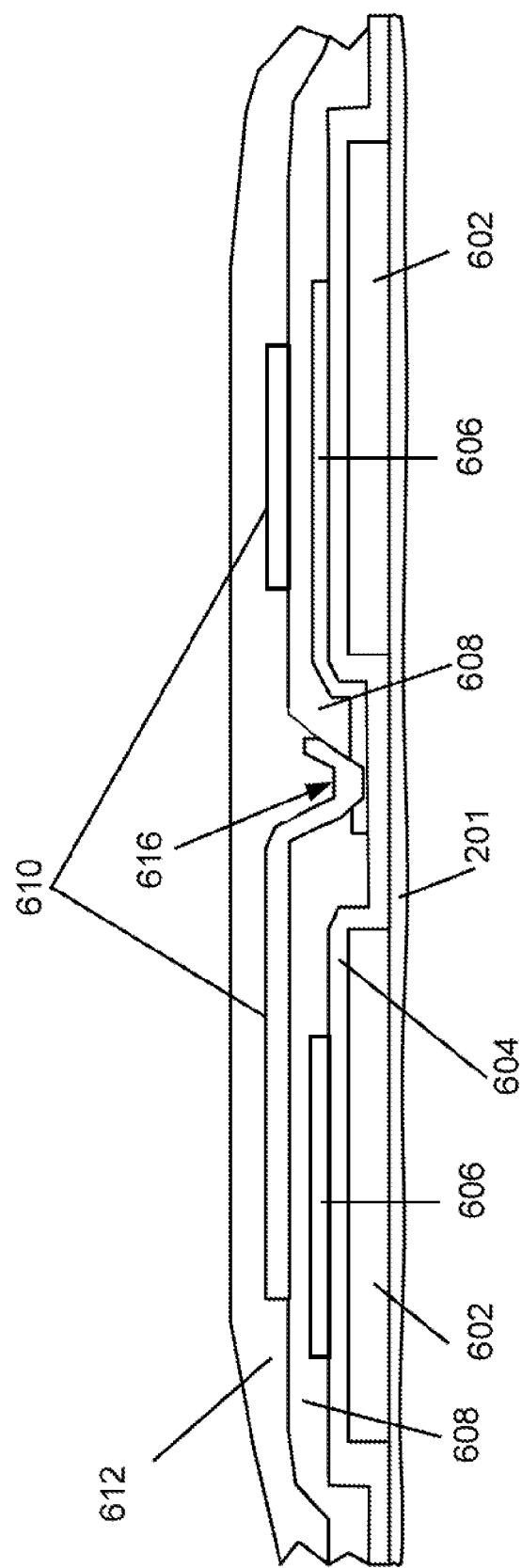
FIG. 6D is a cross sectional view taken along line 6D-6D of FIG. 6A.

In one illustrative embodiment, depicted in FIG. 5, a buck converter circuit 500 is provided. In this example the circuit includes two transistor switches 502, 503 the inductor 504, and a capacitor, 506. With appropriate control signals on the switches, this circuit will efficiently convert a larger input voltage to a smaller output voltage. Many such circuits incorporating inductors are known to those in the art. This type of circuit may be a standalone power converter, or part of a chip or component thereof, microprocessor or component thereof, application specific integrated circuit (ASIC), etc. The particular circuit in FIG. 5 is for a single phase buck converter using a non-coupled inductor as shown in FIG. 6. Other circuits that are well known in the art are suitable for use with the inventive coupled inductors described herein and may be implemented in various embodiments.

In other approaches, the thin film inductor may be integrated into electronics devices where they are used in circuits for applications other than power conversion. The system may have the thin film inductor may be a separate component, or physically constructed on the same substrate as the electronic device.

Now referring to FIG. 6A-6D, according to one general embodiment, a thin film spiral inductor 600 may include a bottom yoke 602 which may incorporate a magnetic material; and a first insulating layer 604 above the bottom yoke 602.

In one approach, the bottom yoke material may incorporate any possible material discussed herein, including any other yoke material which would be apparent in various embodiments to one of skill in the art upon reading the present description. Similarly, the first insulating material may include any possible material discussed herein, including any other insulating material which would be apparent in various embodiments to one of skill in the art upon reading the present description.

The thin film spiral inductor 600 may further include a first turn 606 of a spiral conductor above the bottom yoke 602 and separated therefrom by the first insulating layer 604. The conductor may incorporate any conductor material disclosed herein or which would be apparent in various embodiments to one of skill in the art upon reading the present description.

The thin film spiral inductor 600 may further include a second insulating layer 608 above the first turn 606; a second turn 610 of the spiral conductor above the second insulating layer 608; a third insulating layer 612 above the second turn 610; and possibly a non-planar top yoke 614 above the third insulating layer 612, the top yoke may include a magnetic material.

The thin film spiral inductor 600 may additionally include a connector 616 which transfers the current flowing through the first turn 606 to the overlying second turn 610. Preferably, the current flows in the same direction, and is equal in magnitude for both the first 606 and second 610 turns of the thin film spiral inductor 600. In various approaches, a connector may be a conductive wire, an electrically insulated conductive wire, a printed circuit board via, etc. or any other connector which, according to various applications, would be apparent to one of skill in the art upon reading the present description.

In one approach, a spiral conductor may include any of the conductive materials described above, including any other conductive material which would be apparent in various embodiments to one of skill in the art upon reading the present description.

Similarly, in one approach, a first 604 and/or second 608 and/or third 612 insulating layer may be composed of different, similar or the same materials of each other, or any combination thereof which may include insulating metal oxides, organic materials, polymerics, etc. or any of the insulating materials described above including any other insulating material which would be apparent in various embodiments to one of skill in the art upon reading the present description.

In another approach, the current in the two turns of the spiral inductor may flow in opposite directions and/or may be different in magnitude. Such approach may omit the connector 616, be configured so that the second turn 610 doubles back over the first turn 606, etc.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A thin film coupled inductor, comprising:
a wafer substrate;
a bottom yoke comprising a magnetic material above the wafer substrate;
a first insulating layer above the bottom yoke;
a first conductor above the bottom yoke and separated therefrom by the first insulating layer;
a second insulating layer above the first conductor;
a second conductor above the second insulating layer, the second conductor being separated from the first conductor by the second insulating layer, the second conductor being electrically isolated from the first conductor;
a third insulating layer above the second conductor; and
a non-planar top yoke above the third insulating layer, the top yoke comprising a magnetic material.

2. The thin film coupled inductor as recited in claim 1, wherein the top and bottom yoke are coupled to each other by a low reluctance path in via regions of the inductor, the via regions including a nonmagnetic layer separating the top yoke from the bottom yoke.

3. The thin film coupled inductor as recited in claim 2, wherein the via regions of the inductor include end regions of the top yoke that extend from above an upper surface of the second conductor to below a plane extending along a lower surface of the first conductor.

4. The thin film coupled inductor as recited in claim 1, wherein the top and bottom yoke are in physical contact in a via region of the inductor.

5. The thin film coupled inductor as recited in claim 1, wherein the conductors extend beyond edges of the top yokes.

6. The thin film coupled inductor as recited in claim 1, wherein a width of each conductor in a direction perpendicular to a plane of deposition thereof and perpendicular to a longitudinal axis thereof is at least 5 times a deposition thickness thereof.

7. The thin film coupled inductor as recited in claim 1, wherein the second conductor has opposite sidewalls along a length thereof that are about vertically aligned with opposite sidewalls of the first conductor extending along a length of the first conductor.

8. The thin film coupled inductor as recited in claim 1, wherein the conductors and top yoke have physical characteristics of in-situ formation by thin film processing, wherein at least one of the first, second and third insulating layers includes a polymeric layer having a thickness greater than a deposition thickness of the bottom yoke, wherein a width of each conductor in a direction perpendicular to a plane of deposition thereof and perpendicular to a longitudinal axis thereof is at least 5 times a deposition thickness thereof; and further comprising a second non-planar top yoke, wherein the top yokes are separate yokes and are laterally spaced from one another along discrete portions of the third insulating layer.

9. The thin film coupled inductor as recited in claim 1, wherein at least one of the conductors has a spiral shape.

10. The thin film coupled inductor as recited in claim 1, further comprising a second bottom yoke spaced from the bottom yoke, a third conductor above the second bottom yoke, and a second top yoke above the third conductor, wherein the second conductor extends between the second top and bottom yokes, wherein the second conductor is positioned above or below the third conductor.

11. A system, comprising:
an electronic device; and
a power supply or power converter incorporating a thin film coupled inductor as recited in claim 1, wherein the system is configured to pass a current through the first conductor in a first direction and pass a current through the second conductor in a second direction whereby the current passing through a portion of the second conductor directly overlying a portion of the first conductor passes in an opposite direction as the current passing through the portion of the first conductor, wherein the portion of the second conductor through which the oppositely-oriented current travels lies directly above the portion of the first conductor in a direction orthogonal to a plane of deposition of the bottom yoke.

12. The system as recited in claim 11, wherein the thin film inductor and the electronic device are physically constructed on a common substrate.

13. The system as recited in claim 11, wherein the top and bottom yoke are in physical contact in a via region of the inductor.

14. The system as recited in claim 11, wherein the top and bottom yoke are coupled to each other by a low reluctance path in a via region of the inductor, the via regions including a nonmagnetic layer separating the top yoke from the bottom yoke.

15. The system as recited in claim 11, wherein the second conductor has opposite sidewalls along a length thereof that are about vertically aligned with opposite sidewalls of the first conductor extending along a length of the first conductor, wherein at least one of the first, second and third insulating layers includes a polymeric layer having a thickness greater than a deposition thickness of the bottom yoke, wherein a width of each conductor in a direction perpendicular to a plane of deposition thereof and perpendicular to a longitudinal axis thereof is at least 5 times a deposition thickness thereof; and further comprising a second non-planar top yoke, wherein the top yokes are separate yokes and are laterally spaced from one another along discrete portions of the third insulating layer.

16. The system as recited in claim 11, wherein at least one of the conductors has a spiral shape.

17. The system as recited in claim 11, further comprising a second bottom yoke spaced from the bottom yoke, a third conductor above the second bottom yoke, and a second top yoke above the third conductor, wherein the second conductor extends between the second top and bottom yokes, wherein the second conductor is positioned above or below the third conductor.

18. A thin film spiral inductor, comprising:
a wafer substrate;
a bottom yoke comprising a magnetic material above the wafer substrate;
a first insulating layer above the bottom yoke;
a first turn of a spiral conductor above the bottom yoke and separated therefrom by the first insulating layer;
a second insulating layer above the first turn;
a second turn of the spiral conductor above the second insulating layer;
a third insulating layer above the second turn;
a first non-planar top yoke above the third insulating layer, the first top yoke comprising a magnetic material; and a second non-planar top yoke above the third insulating layer, the second top yoke comprising a magnetic material, wherein the first and second non-planar top yokes are separate yokes and are laterally spaced from one another along discrete portions of the third insulating layer.

19. A system, comprising:

an electronic device; and a power supply or power converter incorporating a thin film spiral inductor as recited in claim 18.

20. The thin film spiral inductor as recited in claim 18, wherein the first and second non-planar top yokes have a common plane of deposition, thereby being about equidistantly spaced from a top surface of the second turn.

* * * * *